United States Patent
De Doncker et al.

(10) Patent No.: US 7,943,956 B2
(45) Date of Patent: May 17, 2011

(54) SEMICONDUCTOR DEVICE COMPRISING A HOUSING CONTAINING A TRIGGERING UNIT

(76) Inventors: Rik W. De Doncker, Leuven (BE);
Peter Koellensperger, Nuremberg (DE)

(*) Notice: Subject to any disclaimer, the term of this patent is extended or adjusted under 35 U.S.C. 154(b) by 362 days.

(21) Appl. No.: 12/093,482

(22) PCT Filed: Nov. 14, 2006

(86) PCT No.: PCT/EP2006/010916
§ 371 (c)(1),
(2), (4) Date: Aug. 13, 2008

(87) PCT Pub. No.: WO2007/054368
PCT Pub. Date: May 18, 2007

(65) Prior Publication Data
US 2009/0096503 A1    Apr. 16, 2009

(30) Foreign Application Priority Data

Nov. 14, 2005  (DE) .................. 10 2005 054 543

(51) Int. Cl.
*H01L 29/66* (2006.01)
*H01L 21/00* (2006.01)
*H03K 17/72* (2006.01)

(52) U.S. Cl. . 257/147; 257/181; 257/724; 257/E29.212; 327/440; 438/117

(58) Field of Classification Search .................. None
See application file for complete search history.

(56) References Cited

U.S. PATENT DOCUMENTS

| | | | |
|---|---|---|---|
| 4,929,856 A | | 5/1990 | Güning |
| 5,346,859 A | * | 9/1994 | Niwayama ............ 29/854 |
| 5,489,802 A | * | 2/1996 | Sakamoto et al. ........ 257/688 |
| 6,078,066 A | | 6/2000 | Akamatsu et al. |
| 6,303,987 B1 | | 10/2001 | Kawamura et al. |
| 6,323,547 B1 | * | 11/2001 | Kawamura et al. ........ 257/688 |
| 6,423,988 B1 | * | 7/2002 | Sato ............ 257/181 |

FOREIGN PATENT DOCUMENTS

| | | |
|---|---|---|
| JP | 3266467 | 11/1991 |
| JP | 04352457 A | * 12/1992 |
| JP | 11235012 | 8/1999 |

* cited by examiner

*Primary Examiner* — Alonzo Chambliss
(74) *Attorney, Agent, or Firm* — International IP Law Group

(57) ABSTRACT

A housing for a semiconductor device is disclosed. In an exemplary embodiment of the present invention, the housing comprises a semiconductor substrate that is arranged between two contact elements, one contact element forming an anode contact element and another contact element forming a cathode contact element, the semiconductor substrate having, on at least one surface, a gate electrode that is contacted by a gate contact element, the first contact element forming a surface arranged across from the gate electrode and at a distance from the gate electrode. Also included is at least one driver unit for generating a gate current, the driver unit comprising a first terminal that is contacted with the gate contact element, and a second terminal that is contacted with a first of the two contact elements. A housing according to an exemplary embodiment of the present invention additionally comprises a spring element arranged so that a spring force brings the gate contact element into pressure contact with the gate electrode and, at substantially the same time, the spring force brings the second terminal of the driver unit into pressure contact with the surface of the first contact element that is located across from the gate electrode.

15 Claims, 11 Drawing Sheets

SEMICONDUCTOR DEVICE COMPRISING A HOUSING CONTAINING A TRIGGERING UNIT

CROSS REFERENCE TO RELATED APPLICATIONS

Pursuant to 35 U.S.C. §371, this application is the United States National Stage Application of International Patent Application No. PCT/EP2006/010916, filed on Nov. 14, 2006, the contents of which are incorporated by reference as if set forth in their entirety herein, which claims priority to German Patent Application No. 102005054543.2, filed Nov. 14, 2005, the contents of which are incorporated by reference as if set forth in their entirety herein.

BACKGROUND

An exemplary embodiment of the present invention relates to a circuit arrangement for turning on and turning off a semiconductor component that can be controlled via a gate terminal, said circuit arrangement being suitable for use in the semiconductor device.

It is a known procedure to employ high-power switches in the form of GTOs (gate turn-off thyristors) or GCTs (gate commutated thyristors), for example, in inverters. These semiconductor components are turned on by a gate current pulse. In order to turn off the components, in the case of the GTO, part of the anode current and, in the case of the GCT, even all of the anode current, is fed out of the semiconductor via the gate. In order to ensure that the semiconductor component is turned off homogenously, the turn-off procedure has to be carried out as quickly as possible, that is to say, with a high change rate $dI_G/dt$ of the gate current $I_G$. This prevents current filaments that have a very high current density and that could damage the semiconductor from forming in the areas of the semiconductor that are not yet turned off.

FIG. 1 shows a schematic depiction of the circuit diagram of a driver circuit for such a semiconductor component S1. The circuit comprises a turn-on circuit for turning on the component in which the gate-cathode channel (between the gate terminal G and the cathode K), a voltage source U1 and a suitably selected resistor R1 are connected in series. The gate current pulse to turn on the semiconductor component S1 is generated in this electric circuit by means of the voltage source U1. Moreover, the driver circuit comprises an electric turn-off circuit in which a switch S2 as well as a voltage source C1 are connected in series to the gate-cathode channel of the semiconductor component S1. As a rule, the switch S2 is configured as a MOSFET and can be triggered, for example, by the current source U1. As a rule, the voltage source C1 is configured as a capacitor that is charged by means of an energy source U2. The capacitor voltage ensures a rapid increase in the gate current during the turn-off procedure. The capacitor voltage, however, is limited by the blocking ability of the gate-cathode channel. This is why great importance is ascribed to the leakage inductance of the turn-off circuit.

European patent application EP 0 328 778 A1 describes a high-power switch that can be turned off via a gate, whereby the driver unit is divided into a plurality of sub-units that are connected in parallel and integrated into the housing of the high-power switch. This eliminates the need for long feed lines between the gate and the driver circuit, as a result of which the leakage inductance of the electric turn-off circuit is reduced.

SUMMARY OF THE INVENTION

An exemplary embodiment of the present invention may provide a low-inductive driver circuit for a power semiconductor whose design is as simple and compact as possible.

Accordingly, a semiconductor device in accordance with an exemplary embodiment of the present invention is provided in which the first contact element forms a surface arranged across from the gate electrode and at a distance from the gate electrode. A spring element may be arranged in such a way that it presses the gate contact element against the gate electrode and, at the same time, presses the second terminal against the surface.

One advantage of an exemplary embodiment of the present invention is that a spring element presses the gate contact element against the gate electrode of the semiconductor substrate and it also presses the second terminal of the driver unit against a surface of the first contact element. As a result, a reliable pressure contact is established between the gate electrode and the gate contact element on the one hand, and between the second terminal of the driver unit and the first contact element on the other hand. At the same time, the driver unit can be affixed by the spring element. Due to the multiple function of the spring element, the device has a compact and simple design.

In an exemplary embodiment of the present invention, it is provided that the spring element is arranged between the gate contact element and the driver unit.

As a result, the driver unit is brought into direct contact with the first contact element, the latter being the anode contact or the cathode contact of the semiconductor component which normally is connected to a heat sink. Consequently, heat generated in the driver unit can be reliably dissipated via the first contact element.

Another exemplary embodiment of the present invention provides that the driver unit has at least one switch that is arranged on a surface of the support element facing the gate electrode and that is contacted with the gate contact element.

In such an exemplary embodiment, the switch is advantageously brought directly into contact with the gate contact element.

In another exemplary embodiment of the present invention, the switch is a MOSFET that has a metal housing that forms a drain terminal of the MOSFET, and the spring force brings a conductive board that is contacted with the gate contact element into pressure contact with the metal housing.

MOSFETs of the type described are known by the designation "DirectFET" and are manufactured and sold by the International Rectifier company. Their metal housings may be advantageously brought into pressure contact with a conductive board, as a result of which an especially reliable contacting of the MOSFETs is ensured.

Another exemplary embodiment of the present invention is characterized in that the spring force generated by the spring element acts essentially perpendicular to the surface of the support element.

This ensures a very high level of stability of the driver unit.

Moreover, an exemplary embodiment of the present invention provides that the driver unit has at least one capacitor, the capacitor being arranged on a surface of the flat support element facing away from the gate electrode and is contacted with the first contact element.

Advantageously, the capacitor in this exemplary embodiment of the present invention is brought into direct contact with the first contact element. Owing to the direct contacting of the capacitor and to its normal good thermal conductivity, the heat can be reliably conducted to a heat sink via the first contact element.

In one exemplary embodiment of the present invention, a first terminal of the capacitor is attached to the support element.

In another exemplary embodiment of the present invention, it is provided that a second terminal of the capacitor forms the second terminal of the driver unit and, by means of the spring force, said second terminal is brought into pressure contact with the surface of the first contact element located across from the gate electrode.

Advantageously, the second terminal in such an exemplary embodiment of the present invention is not connected to the support element, but rather, it forms the second terminal of the driver unit that is brought into pressure contact with the first contact element. As a result, thermal expansions of the capacitor can be compensated for by means of the spring element, without causing mechanical strain at the terminals of the capacitor, which could damage the terminals.

As an alternative, an exemplary embodiment of the present invention provides that a second terminal of the capacitor is contacted with a conductive board, the conductive board forming the second terminal of the driver unit, and, using the spring force, said second terminal is brought into pressure contact with the surface of the first contact element located across from the gate electrode.

In the case of this exemplary embodiment of the present invention as well, thermal expansion of the capacitor is compensated for by the spring element. The conductive board also increases the stability.

In an exemplary embodiment of the present invention, it is provided that the switch and the capacitor are connected in series between the gate contact element and the first contact element.

Moreover, in an exemplary embodiment of the present invention, it is provided that the switch and the capacitor are arranged on opposite surfaces of the support element.

This achieves a very compact structure of the driver unit.

In an exemplary embodiment of the present invention, it is provided that the semiconductor substrate is configured as a round disk, whereby the gate electrode is located in the center of the surface of the semiconductor substrate.

An exemplary embodiment of the present invention is characterized in that the first contact element has a hollow space in which the gate contact element, the driver unit and the spring element are arranged, the hollow space forming a surface that is located across from the gate electrode.

In such an exemplary embodiment of the present invention, in the area of the central gate electrode of the semiconductor substrate, the first contact element has a hollow space that, in particular, contains the gate contact element and the driver unit. Owing to the central arrangement of the gate electrode and of the driver unit, the resulting electric turn-off circuit has a minimum length, so that the leakage inductance inside the electric turn-off circuit is reduced to a minimum.

Another exemplary embodiment of the present invention is characterized in that the semiconductor substrate has a ring-shaped gate electrode.

In another exemplary embodiment of the present invention, it is provided that the gate contact element is configured to be ring-shaped and that the driver unit has a ring-shaped support element that is arranged concentrically relative to the disk-shaped first contact element, and several switches are arranged at angular distances from each other on a surface of the support element facing the gate electrode.

Advantageously, the gate electrodes and the support element are configured to be ring-shaped and are arranged concentrically relative to the first contact element configured to be disk-shaped. This shape of the first contact element allows the semiconductor substrate to be contacted over a large surface area, thus resulting in a very good electrical and thermal conductivity of the connection between the first contact element and the semiconductor substrate.

Another exemplary embodiment of the present invention entails that several capacitors are arranged at angular distances from each other on the surface of the ring-shaped support element facing away from the gate electrode.

Moreover, an exemplary embodiment of the present invention is characterized in that several spring elements are distributed along a ring, said spring elements exerting a spring force oriented essentially perpendicular to the opposite surfaces of the ring-shaped support element.

In another exemplary embodiment of the present invention, as an alternative to the embodiments presented above, it is provided that several driver units are arranged along a ring, each of said driver units having a first terminal that is contacted with a gate contact element and each such unit being associated with at least one spring element that exerts a spring force that brings the gate contact element into pressure contact with the gate electrode and, at the same time, brings the second terminal of the driver unit into pressure contact with the surface of the first contact element that is located across from the gate electrode.

Semiconductor components such as, for instance, so-called double-gated GCTs that have several gate electrodes are known. Owing to the compact integration of driver units into the housing of a semiconductor device, an exemplary embodiment of the present invention makes it possible to install driver units for several gate electrodes in the housing.

Therefore, an exemplary embodiment of the present invention provides that the semiconductor substrate has a gate electrode on each of the opposite surfaces, said gate electrode being contacted by an associated gate contact element, whereby each gate electrode is associated with at least one driver unit having a first terminal that is contacted with the gate contact element associated with this gate electrode, and having a second terminal that is contacted with one of the two contact elements, each contact element forming a surface that is located across from a gate electrode and that is arranged at a distance from this gate electrode, and each gate electrode being associated with at least one spring element that is arranged in such a way that a spring force brings the gate contact element associated with this gate electrode into pressure contact with this gate electrode and, at the same time, the spring force brings the second terminal of the driver unit associated with this gate electrode into pressure contact with the surface of one of the contact elements that is located across from this gate electrode.

In an exemplary embodiment of the present invention, it is provided that the driver unit comprises a circuit for generating a gate current to turn on and/or to turn off the semiconductor device.

Moreover, an exemplary embodiment of the present invention is characterized in that the semiconductor device is a GCT or a GTO.

In addition to such semiconductor components, other semiconductor components whose driver circuits are integrated into the housing can also be put forward within the scope of an exemplary embodiment of the present invention.

An exemplary embodiment of the invention may entail that at least one MOSFET may be connected in series between a surface of the semiconductor substrate on the cathode side and the cathode contact element.

Furthermore, an exemplary embodiment of the present invention provides that the driver unit comprises at least one switch that is connected in series between the gate contact element and the cathode contact element.

In addition, an exemplary embodiment of the present invention may provide that the switch is arranged on a surface of a flat support element facing the gate electrode, and that the surface of the flat support element facing away from the gate electrode has at least one terminal that forms the second terminal of the driver unit that, using the spring force, is brought into pressure contact with the surface of the first contact element located across from the gate electrode.

In an exemplary embodiment of the present invention, it may be provided that the driver unit comprises a support element arranged, at least in sections, between the semiconductor substrate and the first contact element, said support element having conductive boards on opposite surfaces, and a conductive board located across from the semiconductor substrate is brought into pressure contact with the first contact element by the spring element, the conductive board facing the semiconductor substrate having at least a first segment connected to a cathode electrode of the semiconductor substrate as well as at least a second segment that is insulated from the first segment and that is contacted with the gate contact element, and the first and the second segments each being contacted by means of a switch with the conductive board located across from the semiconductor substrate.

On the basis of the exemplary embodiments of the present invention described above, a semiconductor device of the ETO type (ETO=emitter turn-off thyristor) is advantageously created within the scope of the invention.

Moreover, a circuit arrangement for turning on and off a semiconductor component on and off that can be controlled via a gate terminal is provided, said circuit arrangement comprising an electric turn-off circuit in which a first terminal of a first capacitor that can be charged by an energy source is connected to the gate terminal via a first switch. This circuit arrangement may be characterized in that an electric turn-on circuit is provided in which a current pulse can be generated to turn on the semiconductor component, and, in the electric turn-on circuit, a first terminal of a second capacitor is connected via a second switch to the gate terminal and the first capacitor supplies energy to charge the second capacitor.

Advantageously, the circuit arrangement comprises a combination of a turn-on circuit and a turn-off circuit of a semiconductor component, and the turn-on circuit has a current source in the form of a capacitor that can be charged from the capacitor of the turn-off circuit. As a result, a driver circuit comprising the turn-on circuit and a turn-off circuit can have a very compact design, so that it can be integrated into the housing of the semiconductor component without requiring much extra space.

An exemplary embodiment of the present invention may provide that the first capacitor and the second capacitor are connected to each other in a series circuit, the series connection having a first connecting point between the first terminals of the capacitors, said connecting point being connected to the gate terminal via the second switch, and it also provides that the second terminals of the capacitors are connected to each other in the series connection, the series connection having a second connecting point between the second terminals of the capacitors, said connecting point being connected to the gate terminal via the first switch.

In another exemplary embodiment of the present invention, it is provided that a third connecting point is present in the series connection, said connecting point being connected to an anode terminal or cathode terminal of the semiconductor component.

Moreover, an exemplary embodiment of the present invention may entail that a diode element is provided in the series circuit, and the second capacitor can be charged from the first capacitor via the diode element.

An exemplary embodiment of the present invention may be characterized in that the series connection provides a third connecting point between the two second terminals of the capacitors and a fourth connecting point between the first connecting point and the first terminal of the first capacitor, said third connecting point and said fourth connecting point being connected to each other via a third switch.

Another exemplary embodiment of the present invention may entail that a diode element is installed between the first connecting point and the fourth connecting point.

Furthermore, an exemplary embodiment of the present invention may provide that a resistor is installed in the series electric circuit between the third connecting point and the second connecting point.

In an exemplary embodiment of the present invention, it may be provided that the second switch and the third switch can be switched synchronously.

Moreover, an exemplary embodiment of the present invention may entail that the first capacitor has a greater capacitance than the second capacitor.

Furthermore, in an exemplary embodiment of the present invention, it may be provided that the semiconductor component is a GCT or a GTO.

An exemplary embodiment of the present invention may also relate to a semiconductor device in the form of an ETO, comprising a housing containing a semiconductor substrate that is arranged between an anode contact element and a cathode contact element and that has a gate electrode that is contacted by a gate contact element, where a driver unit is connected in series between the cathode contact element and the gate contact element. The semiconductor device may be characterized in that the driver unit comprises a support element that is arranged at least partially between the semiconductor substrate and the first contact element, said support element having conductive boards on opposite surfaces, and a conductive board located across the semiconductor substrate is in pressure contact with the cathode contact element, and the conductive board facing the semiconductor substrate has at least a first segment connected to a cathode electrode of the semiconductor substrate and least a second segment that is insulated from the first segment and that is contacted with the gate contact element, said first and the second segments each being contacted by means of at least one switch with the conductive board located across from the semiconductor substrate.

In this manner, an ETO is created whose driver unit is advantageously integrated into the housing. As a result, the driver circuit encompassed by the driver unit advantageously exhibits very low inductance.

An exemplary embodiment of the present invention may provide that a contact element is present between the semiconductor substrate and the conductive board located across from the semiconductor substrate, said contact element being in pressure contact with the conductive board and the semiconductor substrate.

Moreover, an exemplary embodiment of the present invention may entail that at least one spring element is arranged between the conductive board and the gate contact element, said spring element bringing the gate contact element into pressure contact with the gate electrode.

The cited and other advantages, special features and practical refinements of the invention also become clear from the embodiments, which will be presented hereinafter making reference to the figures.

DETAILED DESCRIPTION OF SPECIFIC EMBODIMENTS

Figure 2:
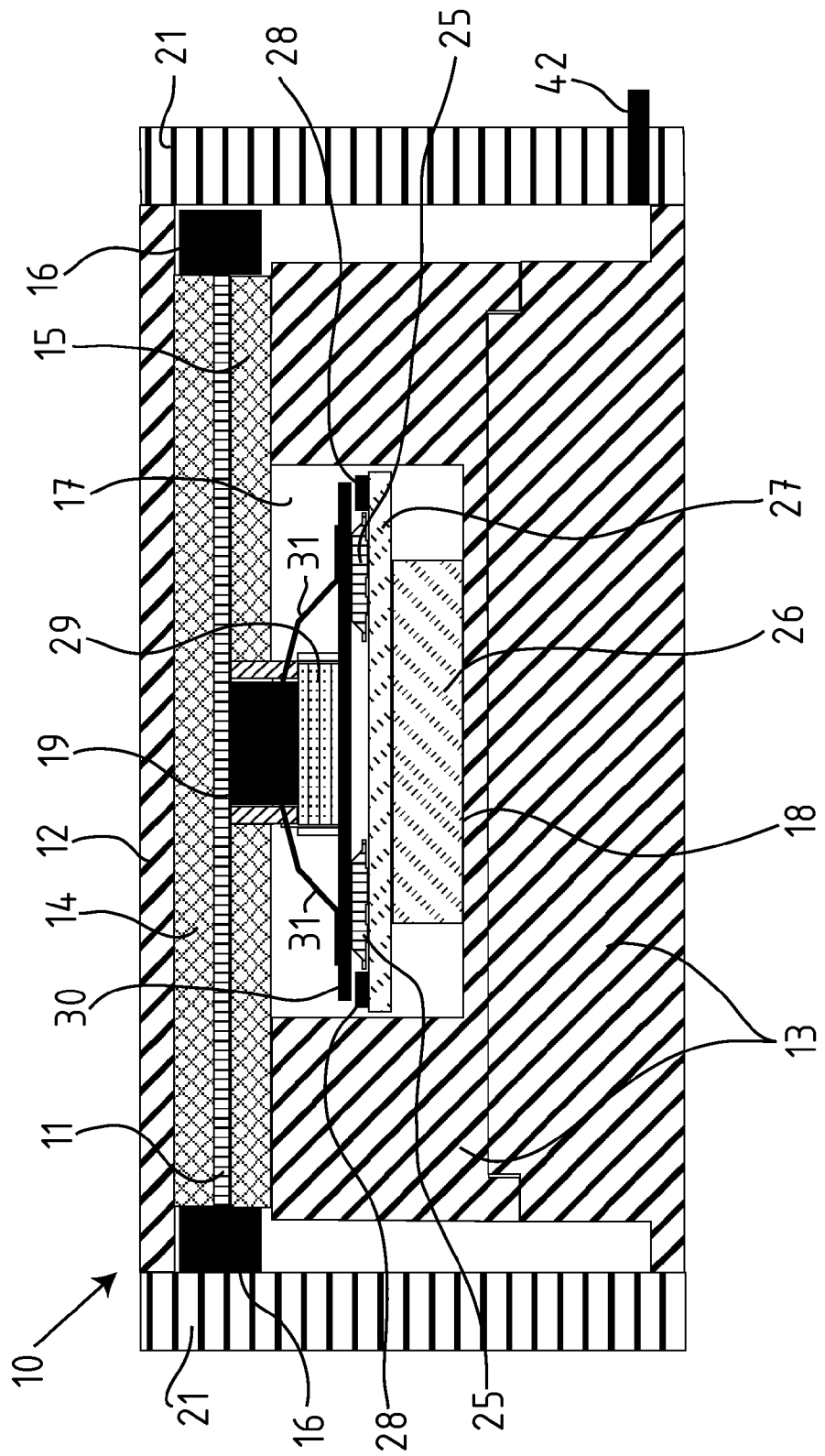
FIG. 2 is a schematic sectional view of a housing of a semiconductor component having an integrated driver unit in accordance with a first exemplary embodiment of the present invention.

FIG. 2 shows a cross section through a ring-shaped housing 10 of a semiconductor component having an integrated electric turn-off circuit in a first embodiment. The housing is configured as a familiar "press-pack" housing in which a stack of several ring-shaped elements are arranged concentrically inside the housing wall 21 and subjected to pressure. The housing wall 21 is usually made of electrically insulating material such as, for example, ceramic. The press pack contains a semiconductor substrate 11 that is typically made up of a silicon wafer that constitutes the actual semiconductor component. This semiconductor component is a GCT in an exemplary embodiment of the present invention. In other exemplary embodiments, however, the semiconductor component can also be, for instance, a GTO, a ZTO (zero-turn-off thyristor) or a GATT (gate-assisted turn-off thyristor). The semiconductor substrate 11 is contacted on the anode side by an anode contact element 12 and on the cathode side by a cathode contact element 13. The cathode contact element 13 and the anode contact element 12 are made of an electrically and thermally conductive material such as, for example, copper and are in contact with a heat sink (not shown in the figure) of the housing 10. A washer 14, 15 made of molybdenum can be arranged between the semiconductor substrate 11 and the anode contact element 12 on the one hand, and the cathode contact element 13 on the other hand, in order to compensate for the difference in the thermal expansion rates of silicon and copper. Since molybdenum has a low thermal expansion coefficient similar to that of silicon, the washers 14, 15 prevent mechanical strains between the semiconductor substrate 11 and the cathode contact element 13 caused by thermal expansion. At the edge of the semiconductor substrate 11, there is a ring-shaped passivation member 16 that raises the strain resistance of the semiconductor component.

In the embodiment shown in FIG. 2, the gate electrode is located in the center of the semiconductor substrate 11. In an area underneath the gate electrode, the cathode contact element 13 has a cutout 17 that is configured, for example, with a cylindrical shape. The bottom of the cutout 17 forms a surface 18 located across from the gate electrode of the semiconductor substrate 11. This cutout 17 accommodates a gate contact element 19 as well as a turn-off unit 20 comprising a circuit for turning off the semiconductor component. The turn-off unit 20 is installed between the gate contact element and the cathode contact element 13. Owing to the central arrangement of the gate electrode and of the turn-off unit 20, the inductance of the turn-off circuit is reduced to a minimum in the embodiment shown in FIG. 2.

Figure 1:
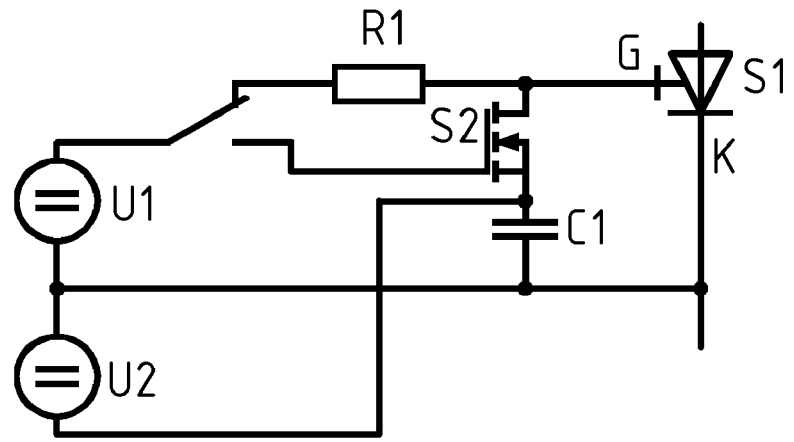
FIG. 1 is a schematic circuit diagram of a driver circuit for a GTO or GCT according to the state of the art.

The turn-off unit 20 comprises several MOSFETs 25 connected in parallel which, together, constitute the switch S2 of the turn-off circuit (FIG. 1), as well as several capacitors connected in parallel that form a capacitor bank 26 that constitutes the voltage source C1 of the turn-off circuit (FIG. 1). The MOSFETs 25 and the capacitor bank 26 are installed on a flat backplane 27. Preferably, the MOSFETs are affixed to a first surface of the backplane 27 and the capacitor bank 26 is affixed to a second surface of the backplane 27 located across from the first surface. Each MOSFET 25 or its gate terminals is preferably associated with a series resistor 28 that is likewise arranged on the first surface of the backplane 27.

The turn-off unit 20 configured in this manner and the gate contact element 19 are together associated with a spring element 29 in a stack where the spring element 29 is preferably located between the gate contact element 19 and the turn-off unit 20. The turn-off unit 20 is oriented inside the stack in such a way that the spring force of the spring element 29 acts essentially perpendicular to the opposite surfaces of the backplane 27 where the MOSFETs 25 and the capacitor bank 26 are arranged.

Moreover, the turn-off unit 20 is preferably oriented in such a way that the MOSFETs 25 are located on the side of the backplane 27 facing the gate electrode, and the capacitor bank 26 is located on the side of the backplane 27 facing away from the gate electrode. One terminal of each MOSFET 25, preferably its drain terminal, is connected to a conductive board 30 arranged inside the stack between the MOSFETs 25 and the spring element 29. The conductive board 30 is contacted with the gate contact element 19 by means of connection lines 31. The other terminals of the MOSFETs 25, which are the source and gate contacts, are contacted with the backplane 27 by means of a soldered connection.

First terminals of the capacitors contained in the capacitor bank 26 are likewise soldered onto the backplane 27 and are connected to the source terminals of the MOSFETs 25 inside the backplane. Second terminals of the capacitors contained in the capacitor bank 26 are preferably contacted with another conductive board (not shown in the figure) that forms the end of the stack facing away from the gate electrode. However, it is possible to dispense with this conductive board so that the second terminals of the capacitors form the end of the stack facing away from the gate electrode.

By means of the spring element 29, the described stack is clamped between the gate electrode of the semiconductor substrate 11 and the surface 18 of the cathode contact element 13. As a result, the stack is affixed, so that no additional holding elements are necessary. Moreover, due to the spring force of the spring element 29, the gate contact element 19 is pressed against the gate electrode of the semiconductor substrate 11, as a result of which the gate contact element 19 is contacted with the semiconductor substrate 11. Any thermal expansion of the gate contact element 19 can be compensated for by the spring element 29. Furthermore, the end of the stack facing away from the gate electrode—said stack being formed either by a conductive board or by the second terminals of the capacitors contained in the capacitor bank 26—is pressed against the surface 18 of the cathode contact element 13 located across from the gate electrode.

This establishes pressure contact between the conductive board or the second terminals of the capacitors and the cathode contact element 13, which ensures good electric conductivity as well as good thermal conductivity. Due to this connection, the heat generated in the turn-off unit 20 and especially inside the MOSFETs 25 can be dissipated via the cathode contact element 13 to the heat sinks of the housing 10. The mounting of the capacitors, which is such that only one terminal is soldered onto the backplane 27, ensures that thermal expansion of the capacitors can be compensated for by the spring element 29. In the case of another conceivable mounting technique in which each of the two terminals of the capacitors is connected to the backplane, mechanical strain and consequently cracks could occur in the backplane 27 due to the usually different thermal expansions of the capacitors and of the backplane 27.

"DirectFETs" manufactured by the International Rectifier company are preferably employed as the field-effect transistors 25. These are MOSFETs in which the MOSFET chips are installed in a metal housing that is open at the bottom. Gate and source electrodes of the chip are located on the open side of the housing and can be soldered directly onto the backplane 27. At the same time, the metal housing constitutes the drain terminal of the MOSFET 25. Consequently, the tops of the housing of the MOSFETs 25 can be brought into direct contact with the conductive board 30 that is pressed by the spring element 29 onto the housing of the MOSFETs 25. This gives rise to a reliable pressure contact between the conductive board 30 and the drain terminals of the MOSFETs 35. The metal housing of the DirectFETs is designed in such a way that it can withstand the pressure load exerted by the spring element 29. Another advantage of DirectFETs is that they do not have any of the bonding wires that often impair the reliability of MOSFETs.

The capacitors contained in the capacitor bank 26 are preferably configured as ceramic multilayer capacitors. The use of such capacitors allows the provision of sufficiently high capacitance values in a small space.

Figure 3:
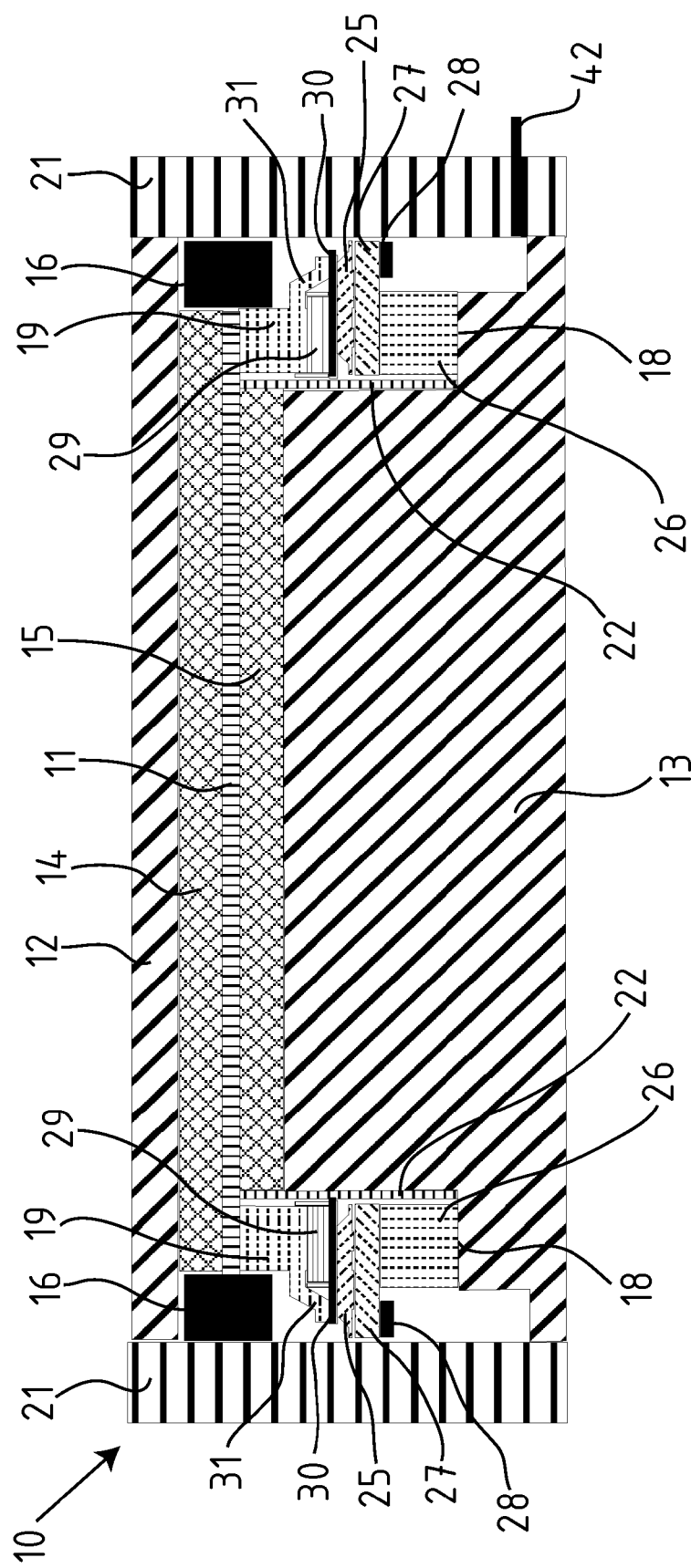
FIG. 3 is a schematic sectional view of a housing of a semiconductor component having an integrated driver unit in accordance with a second exemplary embodiment of the present invention.

FIG. 3 shows a cross section through a ring-shaped housing 10 of a semiconductor component in a second embodiment. The housing 10 is likewise configured as a press-pack housing and contains a stack with the semiconductor substrate 11, the anode contact 12, the cathode contact 13 and, optionally, the washers 14, 15 in the arrangement described above. In the embodiment shown in FIG. 3, the electrode of the semiconductor substrate 11 is configured to be ring-shaped and arranged on the edge of the semiconductor substrate 11. The outer edge of the disk-shaped cathode contact element 13 has a continuous stepped cutout that forms the surface 18 that is located across from the gate electrode of the semiconductor substrate 11. The gate electrode is contacted by the gate contact element 19 which, in an embodiment, is likewise configured to be ring-shaped. The gate contact element 19, together with one or more spring elements 29 and a turn-off unit 20, forms a likewise ring-shaped stack. In this embodiment, the turn-off unit 20 comprises a backplane 27 that is configured in the form of an annular disk.

On the surface of the backplane 27 facing the gate electrode of the semiconductor substrate 11, MOSFETs 25 that are preferably configured as DirectFETs are preferably arranged at regular angular distances. The housings of the DirectFETs are brought into pressure contact with the conductive board 30 located between the spring elements 29 and the MOSFETs 25 by spring elements 29 that are likewise arranged at regular angular distances between the gate contact element 19 and the turn-off unit 20. The conductive board 30 in this embodiment is likewise configured as an annular disk.

In the embodiment shown, the series resistors 28 of the gate terminals of the MOSFETs 25 are installed on the surface of the backplane 27 located across from the gate electrode. These series resistors, however, could also be arranged on the other surface. Moreover, on the surface of the backplane 27 located across from the gate electrode, capacitors are arranged along the ring and form a capacitor bank 26, and first terminals are soldered onto the backplane 27. Second terminals of the capacitors are soldered onto a ring-shaped conductive board (not shown in FIG. 3) that forms the end of the ring-shaped stack facing away from the gate electrode. Due to the force exerted by the spring element 29, this board is pressed against the surface 18 of the cathode contact element 13, as a result of which a reliable pressure contact is established between the board and the cathode contact element 13. As an alternative, the board can be dispensed with, so that the second terminals of the capacitors contained in the capacitor bank 26 form the end of the ring-shaped stack facing away from the gate electrode and are pressed against the surface 18 of the cathode contact element 13 by means of the spring elements 29.

In order to ensure that the cathode contact element 13 is only contacted by the turn-off unit 20 in the area of the surface 18 and that no direct connection is established between the gate contact element 19 and the cathode contact element, the stack is separated along its lengthwise extension from the cathode contact element 13 or the washer 15 on the cathode side by an insulating layer 22.

In other embodiments, the ring-shaped stack described above can be divided into several separate stacks, each forming a ring segment. Each individual stack comprises a gate contact element 19 configured as a ring segment and a spring element 29 and a turn-off unit 20 that comprises one or more MOSFETs 25 and a capacitor bank 26. The structure of the stack corresponds to the structure already described. In this embodiment, the housing 10 has a cross section corresponding to the cross section depicted in FIG. 3.

The embodiments of the housing 10 described above in conjunction with FIG. 3, in which the semiconductor substrate 11 has a ring-shaped gate electrode, have the advantage that the semiconductor substrate 11 is contacted on a larger surface area by the cathode contact element 13 or by the washer 15 than in the embodiment with a central gate electrode shown in FIG. 2. This translates into a more uniform pressure distribution inside the cross section of the press pack and thus into improved contacting in terms of the electrical conductivity and thermal conductivity.

The control signals for controlling the turn-off unit 20, i.e. the signals for triggering the MOSFETs 25, the energy to charge the capacitors contained in the capacitor bank 26 as well as the gate current pulse to turn on the semiconductor component are all supplied by means of an external driver stage 40 in the case of the embodiment of the housing 10 described above. The resulting circuit is shown in FIG. 4 on the basis of a schematic circuit diagram, in which the semiconductor component, in turn, is designated with the reference numeral S1.

The external driver stage 40 contains the current or voltage source U1, which supplies the gate current pulse to turn on the semiconductor component S1. In the schematic depiction shown in the figure, the source U1 is connected to the gate terminal of the semiconductor component S1 via the resistor R1. A DC/DC converter is provided to control the turn-on current. Moreover, in the embodiment shown, the source U1 also supplies the control signals for triggering the switch S2 made up of the MOSFETs 25. By the same token, however, an additional voltage source can be provided inside the external driver stage 40 in order to generate the control signals for the MOSFETs 25. Furthermore, the external driver stage 40 contains the energy source U2, which supplies the energy to charge the capacitor C1 formed by the capacitors contained in the capacitor bank 26.

Figure 4:
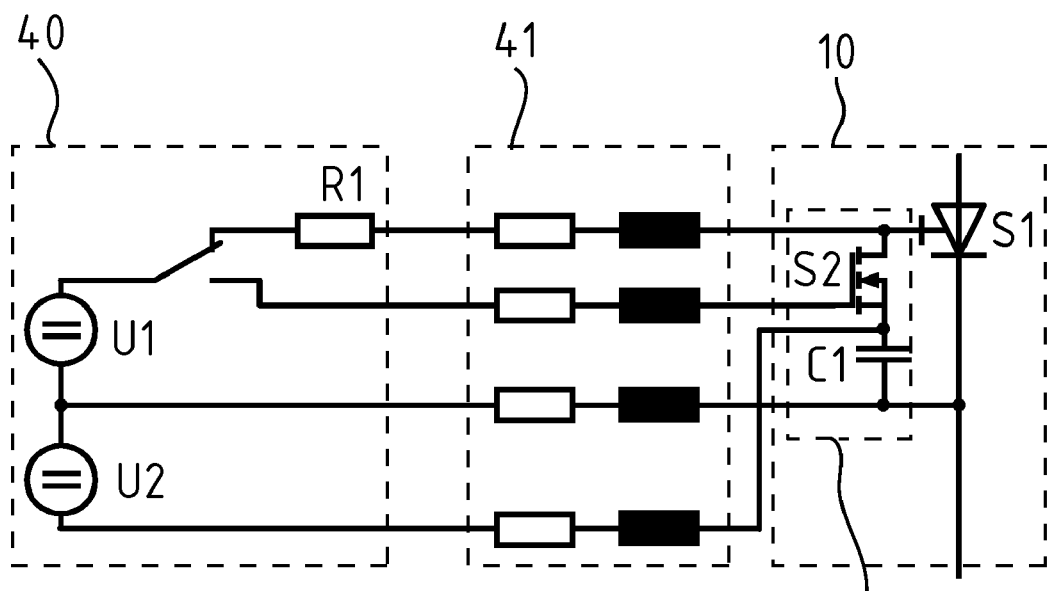
FIG. 4 is a schematic circuit diagram of a semiconductor component having a driver circuit integrated into the housing and having an external driver stage according to an exemplary embodiment of the present invention.

The external driver stage 40 is connected to the housing 10 of the semiconductor component S1 containing the turn-off unit 20 via connection cables 41 that are schematically shown in FIG. 4 by their resistors and inductors. The connection cables 41 pass through a bushing 42 inside the housing wall 21 (FIGS. 2 and 3) into the interior of the housing 10, where they are contacted with the turn-off units 20 situated there. In particular, terminals are provided on the backplane 27 for the connection cables 41.

Since the turn-off units 20 are integrated into the housing 10 of the semiconductor component S1, only currents having a relatively small current intensity or a relatively low change rate of the current intensity flow through the connection cables 41, so that the connection cables 41 do not have to be configured to be particularly low-inductive. This allows the use of longer connection cables 41 and the external driver stage 40 does not have to be mounted directly on the housing 10. As a result, for example, a more compact inverter design is possible. Moreover, the voltage of the capacitors contained in the turn-off units 20 can be reduced owing to the low leakage inductance of the electric turn-off circuit integrated into the housing 10. Consequently, the necessary re-charging capacity is considerably reduced. Since this normally accounts for most of the total power consumption of the external driver stage 40 at the usual clock frequencies, this translates into considerably less power consumption.

Figure 5:
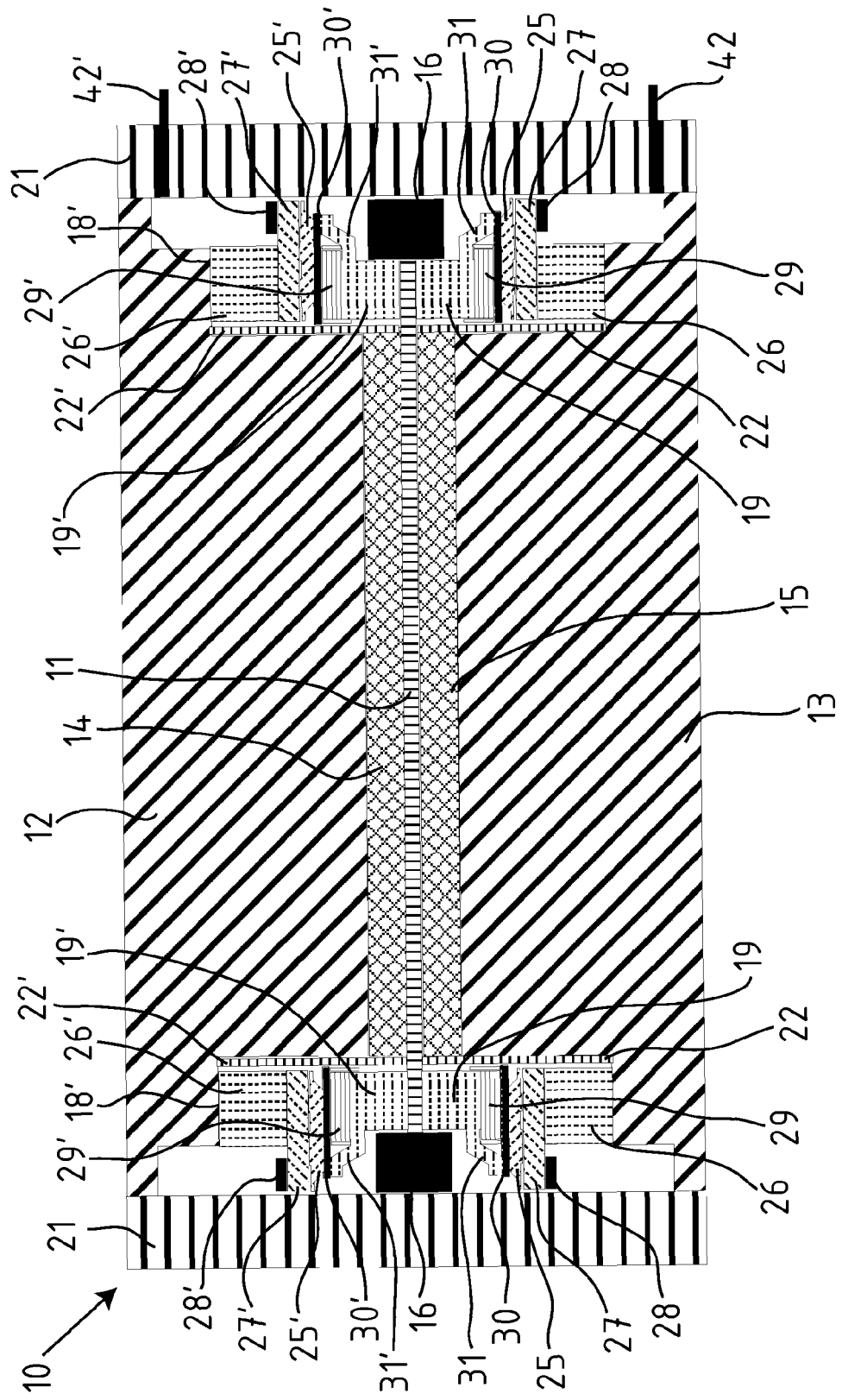
FIG. 5 is a schematic sectional view of a housing of a semiconductor component having two gate electrodes into each of which a driver unit is integrated for each of the two gate electrodes according to an exemplary embodiment of the present invention.

FIG. 5 shows another exemplary embodiment of the present invention in which the semiconductor component has two gate terminals. The semiconductor component in this embodiment can be, for instance, a so-called double-gated GCT. In the embodiment shown, the two gate electrodes of the semiconductor substrate 11 are configured to be ring-shaped. One gate electrode is located on the surface of the semiconductor substrate 11 on the anode side while the second gate electrode is located on the surface of the semiconductor substrate 11 on the cathode side.

The semiconductor substrate 11 is arranged inside a press pack in the housing 10, as already depicted in conjunction with FIGS. 2 and 3. Moreover, the structure of the housing on the cathode side corresponds to the structure described in conjunction with FIG. 3, that is to say, for the gate electrode on the cathode side, one or more turn-off units 20 are provided that are arranged and configured in the manner already explained in conjunction with FIG. 3.

Furthermore, the structure of the housing on the anode side corresponds mirror-image to the structure on the cathode side. Accordingly, the anode contact element 12 here has a stepped cutout that forms a surface 18' that is located across from the gate electrode on the anode side. In an embodiment, a ring-shaped stack with a gate contact element 19', a turn-off unit 20 as well as spring elements 29' positioned between the gate contact element 19' and the turn-off unit 20 are inserted into the cutout. The stack is separated along its lengthwise extension from the anode contact element 12 by an insulating layer 22'.

In this embodiment, the turn-off unit 20 comprises a backplane 27', which is configured in the form of an annular disk. On the surface of the backplane 27' facing the gate electrode of the semiconductor substrate 11 on the anode side, MOSFETs 25', which are preferably configured as DirectFETs, are installed at regular angular distances. The spring elements, 29', which are likewise arranged at regular angular distances between the gate contact element 19' and the turn-off unit 20, bring the housings of the DirectFETs into pressure contact with the conductive board 30' located between the spring elements 29' and the MOSFETs 25'. In this embodiment, the conductive board 30' is likewise configured as an annular disk and is connected to the gate electrode 19' via connection lines 31'.

The series resistors 28' of the gate terminals of the MOSFETs 25' are installed on the surface of the backplane 27' located across from the gate electrode on the anode side. But they can likewise be arranged on the other surface. Moreover, on the surface of the backplane 27' located across from the gate electrode, capacitors are arranged along the ring, the capacitors forming the capacitor bank 26', and first terminals of the capacitors are soldered onto the backplane 27'. Second terminals of the capacitors are soldered onto a ring-shaped conductive board (not shown in FIG. 5) which form the end of the ring-shaped stack facing away from the gate electrode on the anode side. Due to the force exerted by the spring elements 29', this board is pressed against the surface 18' of the anode contact element 12, as a result of which a reliable pressure contact is established between the board and the anode contact element 12. Alternatively, it is possible to dispense with the board, so that the second terminals of the capacitors contained in the capacitor bank 26' form the end of the ring-shaped stack facing away from the gate electrode and are pressed by the spring elements 29' against the surface 18' of the anode contact element 12.

In other embodiments, the ring-shaped stack can be divided into several separate stacks that each form a ring segment. Each individual stack comprises a gate contact element 19' configured as a ring segment as well as at least one spring element 29' and a turn-off unit 20 which especially comprises one or more MOSFETs 25' and a capacitor bank 26'. The structure of the stack corresponds to the structure already described. In this embodiment, the housing 10 has a cross section corresponding to the cross section depicted in FIG. 5.

Figure 6:
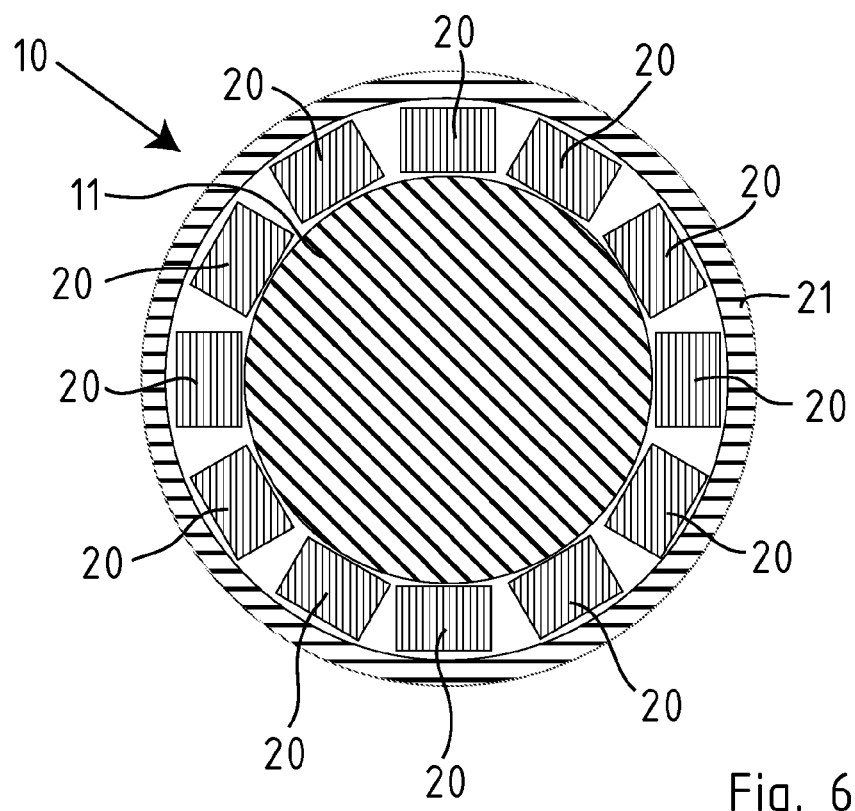
FIG. 6 is a schematic depiction of the arrangement of several driver units in the housing of a semiconductor component in accordance with a first exemplary embodiment of the present invention.

In the embodiments of the housing shown in FIGS. 3 and 5, in which the gate electrode is configured to be ring-shaped, several parallel-connected turn-off units 20 can be provided on the cathode and/or anode side. In FIG. 6, the above-mentioned ring-shaped arrangement of the turn-off units 20 on the cathode side is shown in a horizontal section of the housing 10. The semiconductor substrate 11 in FIG. 6 is shown with a reduced radius in order not to conceal the view of the turn-off units. In the case of the housing 10 with the semiconductor substrate 11 having two gate electrodes, the turn-off units 20 on the anode side can be arranged in the same manner.

Figure 7:
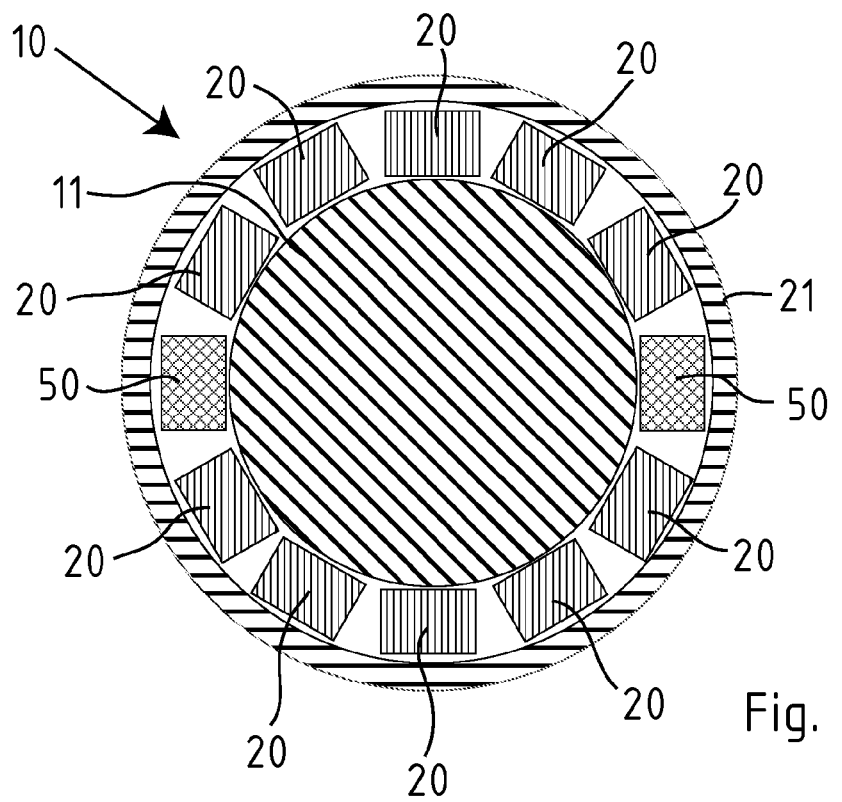
FIG. 7 is a schematic depiction of the arrangement of several driver units in the housing of a semiconductor component in accordance with a second exemplary embodiment of the present invention.
Figure 8:
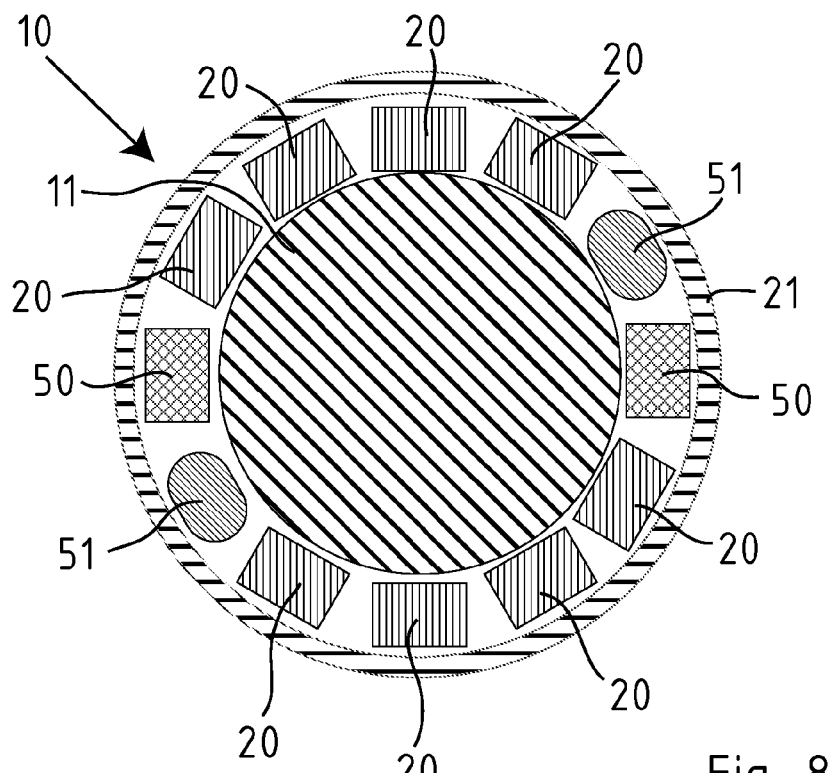
FIG. 8 is a schematic depiction of the arrangement of several driver units in the housing of a semiconductor component in accordance with a third exemplary embodiment of the present invention.
Figure 9:
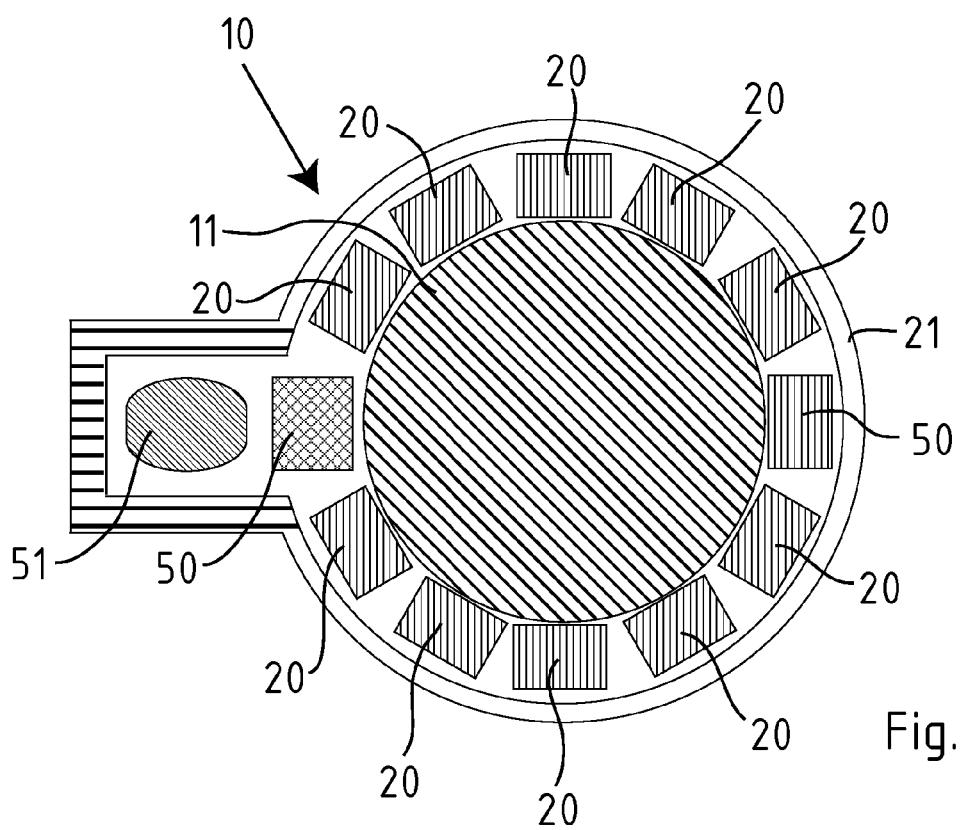
FIG. 9 is a schematic depiction of the arrangement of several driver units in the housing of a semiconductor component in accordance with a fourth exemplary embodiment of the present invention.

Aside from the turn-off units 20, one or more turn-on units 50 and/or one or more control units 51 can also be integrated into the housing 10. FIGS. 7 to 9 schematically show, by way of an example, several arrangements of these units in the housing 10. These arrangements can be selected for driver units on the cathode side as well as on the anode side.

FIG. 7 schematically shows an arrangement in which the turn-off units 20 and turn-on units 50 are arranged in the shape of a ring inside the housing 10. In this context, the turn-on units 50 preferably contain a circuit to generate the gate current pulse that is needed to turn on the semiconductor component. Due to the higher current intensities when the semiconductor component is being turned off, more turn-off units 20 are provided than turn-on units 50. The turn-on units 50 are preferably arranged at equal angular distances on the ring so that a uniform triggering of the gate electrodes can be carried out. FIG. 7 shows, by way of an example, two turn-on units 50 that are arranged at angular distances of 180° on the ring. However, more than two turn-on units 50 can be also provided.

In the arrangement schematically shown in FIG. 8, the housing 10 contains not only several turn-off units 20 and turn-on units 50 but also control units 51, and the provided units 20, 50, 51 are, in turn, arranged in a ring shape in the housing 10. The control units 51 comprise, for example, interfaces to receive control signals to trigger the semiconductor component and a circuit with which the turn-off units 20 and the turn-on units 50 can be triggered in accordance with the control signals. By way of an example, FIG. 8 shows an arrangement with two turn-on units 50 located across from each other on the ring, as well as two control units 51 arranged next to the turn-on units. In principle, however, more or fewer than two turn-on units 50 and/or more or fewer than two control units can be accommodated in the housing.

FIG. 9 shows an arrangement with turn-off units 20 on the cathode side and with a turn-on unit 50, which are arranged in the shape of a ring. A control unit 51 is arranged outside of the ring and preferably next to the turn-on unit 50. The housing 10 can have a bulge to accommodate such an arrangement. The bushing 42, 42' for control lines to trigger the control unit 51 is preferably provided in the area of the bulge in order to allow a simple contacting of the control unit 51.

Figure 10:
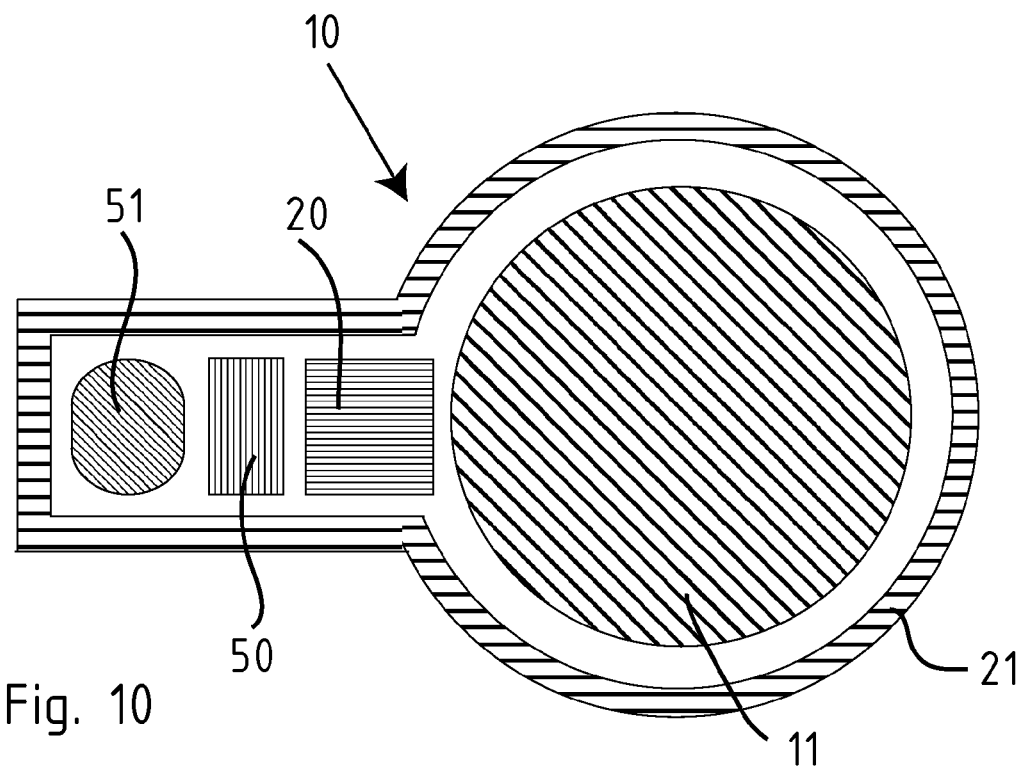
FIG. 10 is a schematic depiction of the arrangement of several driver units in the housing of a semiconductor component in accordance with a fifth exemplary embodiment of the present invention.

FIG. 10 shows an embodiment of the housing 10 in which a turn-off unit 20, a turn-on unit 50 and a control unit 51 are arranged along a line next to the main part of the semiconductor substrate 11, which is configured in the shape of a round disk. Here, a part (not shown in the figure) of the semiconductor substrate 11 containing the gate electrode preferably protrudes beyond at least the turn-off unit 20. The latter is preferably closest to the center of the semiconductor substrate 11 of the units 20, 50, 51, so that the electric turn-off circuit has the shortest possible length. Moreover, the gate electrode can also protrude beyond at least the turn-on unit 50 arranged between the turn-off unit 20 and the control unit 51. In the embodiment shown, the housing 10 has a bulge where the units 20, 50, 51 are accommodated. The bushing 42, 42' for control lines to trigger the control unit 51 is preferably provided in the area of the bulge so as to allow a simple contacting of the control unit 51.

Figure 11:
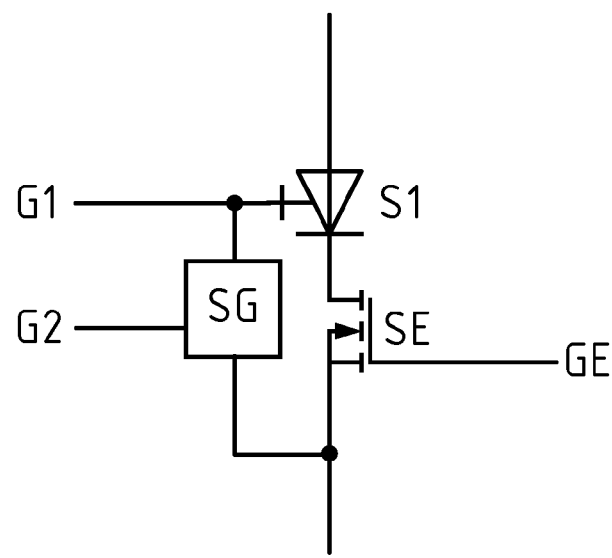
FIG. 11 is a schematic circuit diagram of an ETO according to an exemplary embodiment of the present invention.

Furthermore, an ETO (emitter turn-off thyristor) whose driver circuit is integrated into the housing 10 is provided within the scope of an exemplary embodiment of the present invention. FIG. 11 shows a circuit diagram of an ETO. It consists of a semiconductor component S1 configured as a GTO or GCT, which is serially connected to an emitter switch SE configured as a MOSFET, said emitter switch being connected to the cathode of the semiconductor component S1. The emitter switch SE has a control terminal GE through which the emitter switch can be turned on and off. By means of a gate switch SG likewise configured, for example, as a MOSFET, the cathode is also connected to the gate terminal G1 of the semiconductor component S1. The gate switch SG has a control terminal G2 by means of which the gate switch SG can be turned on and off. In known embodiments of the ETO, the gate switch SG can also contain, for example, a capacitor and/or a Zener diode instead of the MOSFET.

For purposes of turning off the ETO, the emitter switch SE is turned off and the gate switch SG is turned on. Owing to the turned-off emitter switch SE, the cathode current of the semiconductor component S1 is interrupted and the anode current flows via the gate terminal via the gate switch SG out of the semiconductor component S1, which is turned off as a result. In order to turn on the ETO, the emitter switch SE is turned on and the gate switch SG is turned off. Moreover, a current pulse that turns on the ETO is applied to the gate terminal G1 of the semiconductor component S1.

Figure 12:
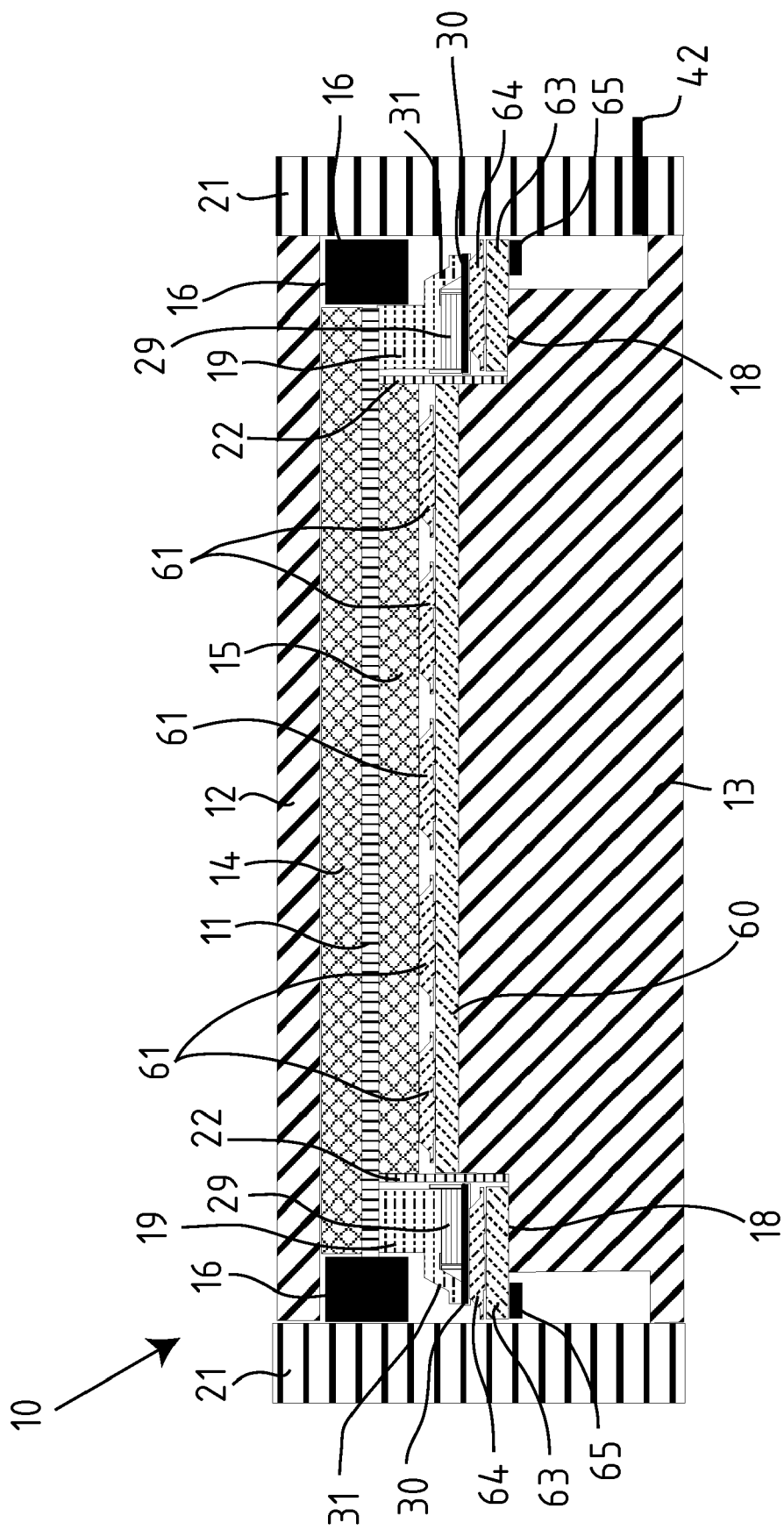
FIG. 12 is a schematic sectional view of a housing of an ETO with an integrated driver circuit in accordance with a first exemplary embodiment of the present invention.

FIG. 12 depicts a housing 10 of the ETO with an integrated driver circuit in a first embodiment. The housing 10 is preferably configured as a press pack. A stack subjected to pressure is arranged inside the housing 10 concentrically relative to the annular housing wall 21. A semiconductor substrate 11 is arranged inside the stack, between the anode contact element 12 and the cathode contact element 13. The semiconductor substrate 11 is a GTO or GCT chip.

A washer 14, 15 made of molybdenum is arranged between the semiconductor substrate 11 and the anode contact element 12 on the one hand, and the cathode contact element 13, on the other hand. A ring-shaped passivation member 16 is arranged at the edge of the semiconductor substrate 11. Between the washer 15 on the cathode side and the cathode contact element 13, there is also a disk-shaped backplane 60. MOSFETs 61 are mounted on the surface of the backplane 60 facing the semiconductor substrate 11. The MOSFETs 61 are preferably configured as DirectFETs, whose metal housings are brought into pressure contact with the washer 15. On the bottom of backplane 60, there are terminals which are connected to the source terminals of the MOSFETs 61 and which are brought into pressure contact with the cathode contact element 13. The MOSFETs 61 form the emitter switch SE of the ETO.

The gate electrode of the semiconductor substrate 11 is configured in the form of a ring and arranged at the edge of the semiconductor substrate 11. The outer edge of the disk-shaped cathode contact element 13 has a continuous stepped cutout that forms the surface 18 that is located across from the gate electrode of the semiconductor substrate 11. The gate electrode is contacted by the gate contact element 19 which, in an embodiment, is likewise configured in the form of a ring. The gate contact element 19, together with one or more spring elements 29 and a gate switch unit, likewise forms a ring-shaped stack.

The gate switch unit corresponds to the gate switch SG of the ETO. In the embodiment shown, it comprises a backplane 63, which is configured in the form of an annular disk. MOSFETs 64, preferably configured as DirectFETs, are installed at angular distances onto the surface the backplane 63 facing the gate electrode of the semiconductor substrate 11. By means of the spring elements 29, which are likewise arranged at regular angular distances between the gate contact element 19 and the gate switch unit, the housings of the DirectFETs are brought into pressure contact with the conductive board 30 located between the spring elements 29 and the MOSFETs 64. In this embodiment, the conductive board 30 is likewise configured as an annular disk.

On the surface located across from the gate electrode, the backplane 63 has terminals that are connected to the source terminals of the MOSFETs 64. Due to the force exerted by the spring elements 29, the backplane 63 or the ends arranged on the surface facing away from its gate electrode are pressed against the surface 18 of the cathode contact element 13, as a result of which a reliable pressure contact is established between the terminals and the cathode contact element 13. In this context, as shown in FIG. 12, the backplane 63 can have a larger outer radius than the surface 18, so that the backplane 63 protrudes beyond the surface 18 in the radial direction. Here, series resistors 65 of the gate terminals of the MOSFETs 64 can be arranged on the protruding part of the surface of the backplane 63 facing away from the gate electrode.

In an embodiment not shown here, in which the gate switch unit comprises one or more capacitors, preferably a capacitor bank is provided which is arranged on the surface of the backplane 63 facing away from the gate electrode and which is contacted with the cathode contact element 13. The arrangement of the capacitor bank corresponds to the arrangement described in conjunction with FIG. 3. In this embodiment, the surface of the backplane 63 facing the gate electrode contains terminals that contact with the gate contact element 19.

In order to ensure that the cathode contact element 13 is only contacted in the area of the surface by the terminals provided for the contacting, the stack is separated along its lengthwise extension from the cathode contact element 13 or the washer 15 on the cathode side and the backplane 60 by an insulating layer 66.

The MOSFETs 61 and 64 are triggered via a control line (not shown in the figure) that can be guided through a bushing 42 in the housing wall 21 into the interior of the housing 10.

In other embodiments, the ring-shaped stack described above, which comprises the gate contact element 19, the spring elements 29 as well as the gate switch unit, can be divided into several separate stacks that each form a ring segment. Each individual stack comprises a gate contact element 19 configured as a ring segment as well as at least one spring element 29 and a gate switch unit, which especially comprises one or more MOSFETs 64. The structure of the stack corresponds to the structure of the ring-shaped stack already described above.

Figure 13:
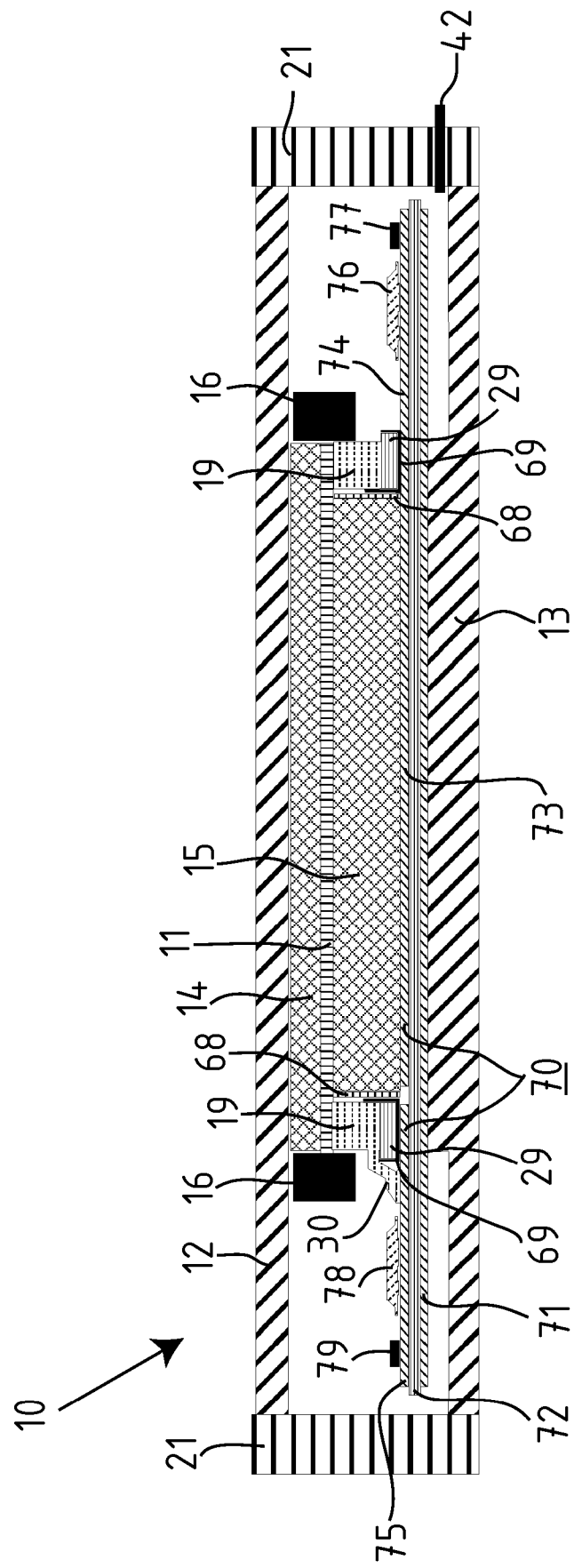
FIG. 13 is a schematic sectional view of a housing of an ETO with an integrated driver circuit in accordance with a second exemplary embodiment of the present invention.

FIG. 13 depicts a housing of the ETO with integrated driver circuits in another embodiment. The housing 10 is preferably once again configured as a press pack. Inside the housing 10, a stack subjected to pressure is arranged concentrically with respect to the ring-shaped housing wall 21. Inside the stack, a semiconductor substrate 11 is arranged between the anode contact element 12 and the cathode contact element 13. The semiconductor substrate 11 is a GTO or GCT chip. A washer 14, 15 made of molybdenum is arranged between the semiconductor substrate 11 and the anode contact element 12 on the one hand, and the cathode contact element 13 on the other hand. A ring-shaped passivation member 16 is arranged at the edge of the semiconductor substrate 11.

A stacked arrangement consisting of a disk-shaped, structured conductive board 70, another disk-shaped, non-structured board 71 and a non-conductive carrier layer 72 located between the boards 70, 71 is arranged between the washer 15 on the cathode side and the cathode contact element 13. The conductive boards 70, 71 are made, for instance, of copper; the carrier layer 72 is made, for example, of ceramic.

Figure 14:
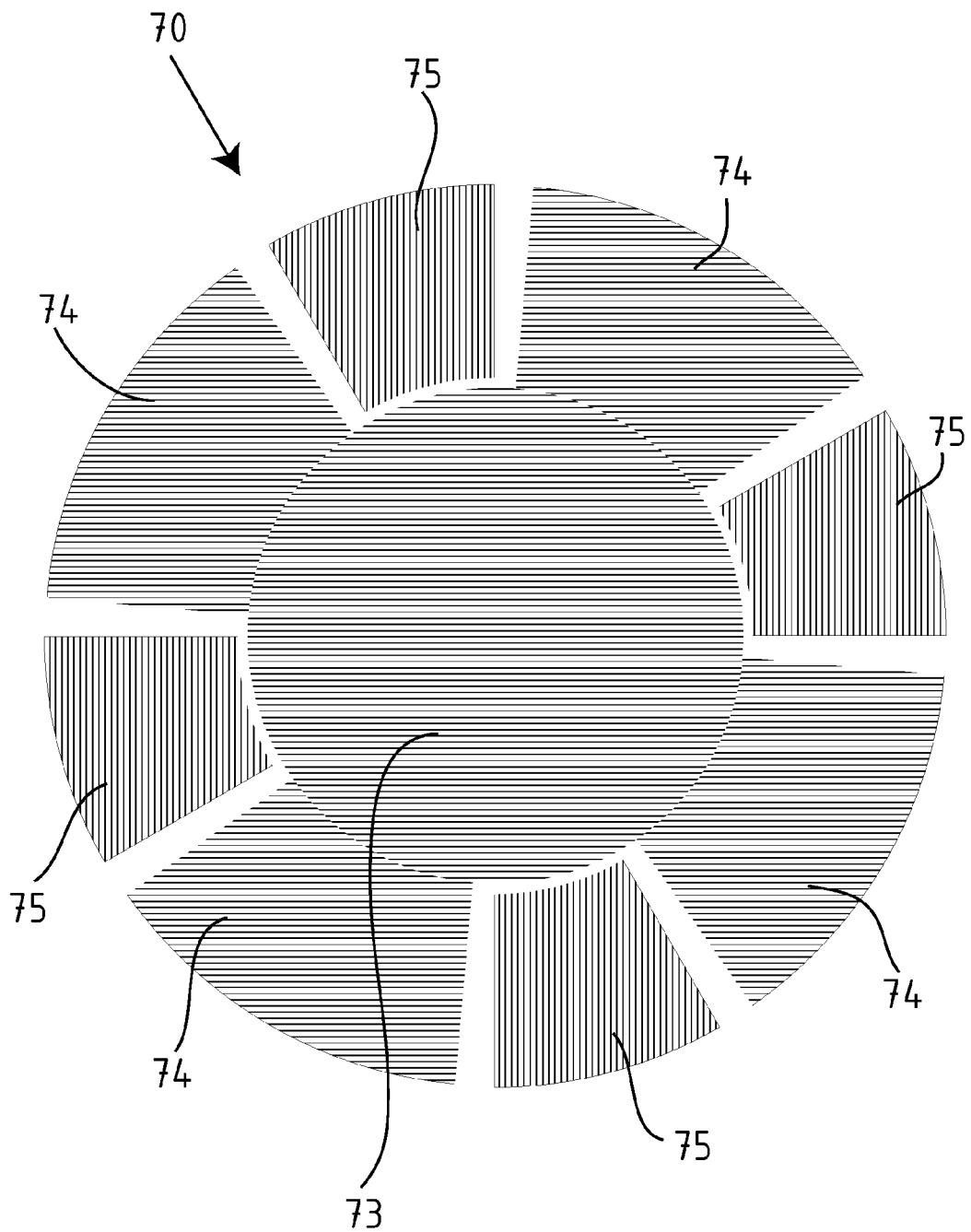
FIG. 14 is a depiction of a structure of a conductive board inside the housing of the ETO, with an integrated driver circuit in accordance with the second exemplary embodiment of the present invention.

The structure of the board 70 is shown in FIG. 14. As can be seen in FIG. 13, the board 70 comprises a circular base element 73. The board 70 has ring segments 74 in a concentric arrangement relative to the base element 73, and the base element 73 and the ring segments 74 are connected to each other or configured as a single piece. Between the ring segments 74, additional ring segments 75 are arranged concentrically relative to the base element 73, but they are not connected to the base element 73 nor to the ring segments 74.

The base element 73 of the conductive board 70 is contacted with the washer 15 on the cathode side inside the press pack. The ring segments 74 connected to the base element 73 protrude beyond the washer 15. MOSFETs 76 and series resistors 77 of the gate terminals of the MOSFETs 76 are arranged on the ring segments 74. The load channels of the MOSFETs are connected in series between the conductive board 70 or the ring segments 74 and the conductive board 71 and they are, in turn, contacted with the cathode contact element 13. Therefore, the MOSFETs 76 form the emitter switch SE of the ETO.

In the embodiment shown, the gate electrode of the semiconductor substrate 11 has an annular shape and is contacted by a ring-shaped gate contact element 19. Spring elements 29 which are attached by means of a holder 69 are arranged at regular distances between the gate contact element 19 and the conductive board 70. Moreover, the spring elements are insulated from the washer 15 by means of an insulating layer 68. The spring elements 29 press the gate contact element 19 against the gate electrode of the semiconductor substrate 11, so that a good electric contact is ensured. Moreover, the spring elements 29 press a part of the conductive board 71 that protrudes beyond the washer 15 on the cathode side against a surface of the cathode contact element 13, so that the contact surface area between the conductive board 71 and the cathode contact element is enlarged. In the area of the ring segments 74 connected to the base element 73 of the board 70, the gate contact element 19 is insulated from the conductive board 70. For example, the holder 69 of the spring elements 29 can be made of an insulating material, at least in the area of the ring segments 74 of the conductive board 70, for purposes of preventing that an electric contact is established via the spring elements 29.

MOSFETs 78 as well as series resistors 79 of the gate terminals of the MOSFETs 78 are arranged on the ring segments 75 that are not connected to the base element 73. The source-drain channel of the MOSFETs 78 is installed between the ring segments 75 of the board 70 and the conductive board 71 that is contacted with the cathode contact element 13. Therefore, the MOSFETs 78 form the gate switch SG of the ETO.

The MOSFETs 76 and 78 are triggered via control lines not shown in the figure, which can be guided through a bushing 42 in the housing wall 21 into the interior of the housing 10.

As already described above, gate-controlled semiconductor components such as, for instance, GCTs or GTOs, are turned on by a current pulse. In order to ensure a homogenous turning on of the component, the current pulse has to have a high slew rate and a high amplitude (typically between 50 A and 200 A). Once the current pulse has subsided, as a rule, a continuous current is applied to the gate in order to ensure that the semiconductor component does not turn off when the anode current drops. At a zero crossing and at very high change rates of the anode current, another current pulse is necessary, like during the turning-on operation. Due to the length of the cable connections inside the turn-on circuit, the latter has a significant impedance, which has a detrimental influence on the current pulse. This is why a circuit for generating the current pulse is likewise integrated into the housing. The continuous current is generated externally in a driver stage of the power semiconductor.

Figure 15:
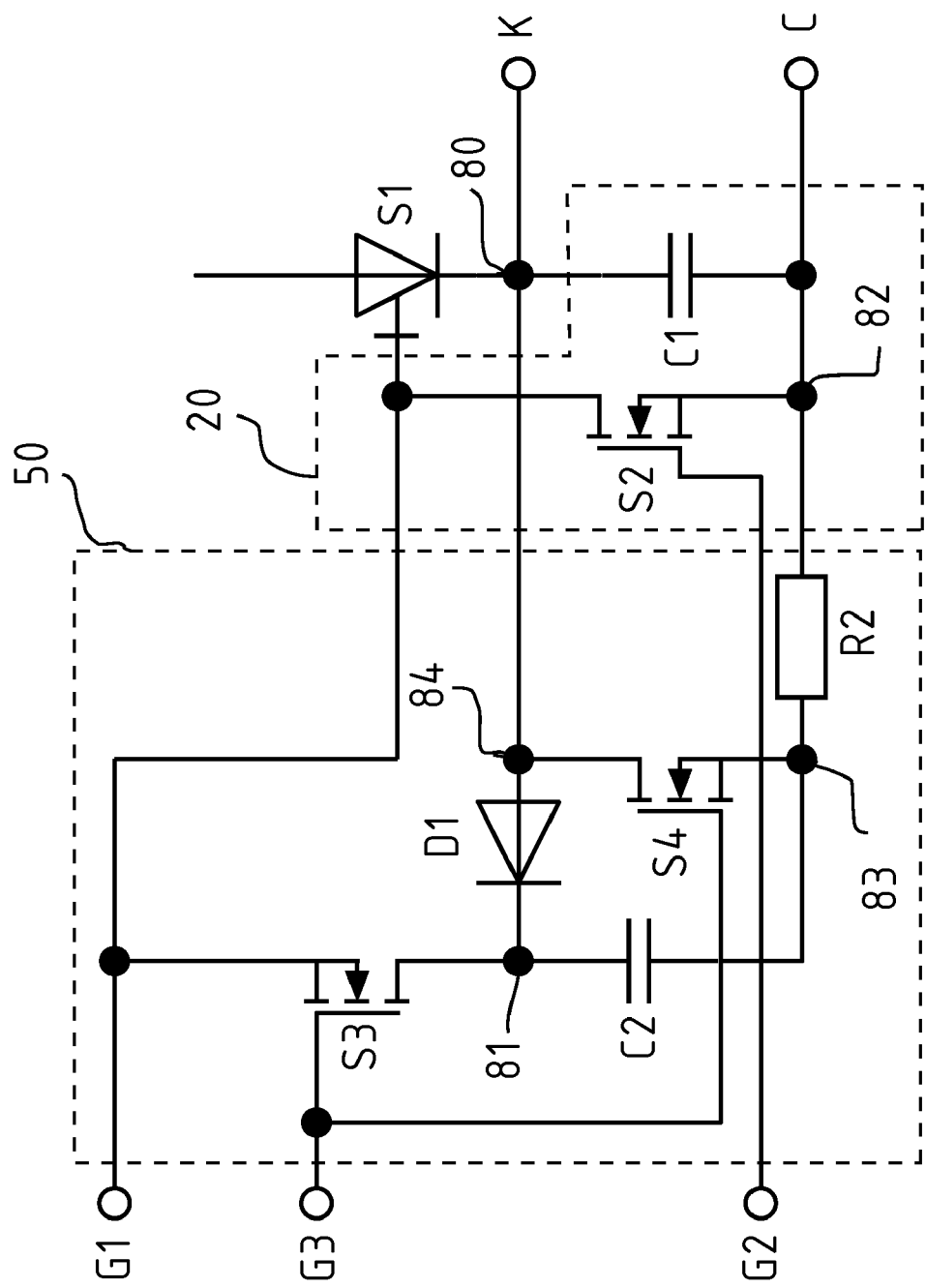
FIG. 15 is a schematic circuit diagram of a circuit arrangement containing a turn-on circuit and a turn-off circuit of a GCT or GTO in accordance with an exemplary embodiment of the present invention.

FIG. 15 shows a circuit arrangement that combines a turn-on circuit and the turn-off circuit—already shown in FIG. 1—of a semiconductor component S1. This translates into a particularly compact structure of the entire driver circuit of the gate electrode of the semiconductor component, and this compact structure allows the entire driver circuit to be integrated into the housing 10 of the semiconductor component. The semiconductor component is, for example, a GCT or a GTO.

The semiconductor component is, again, designated with the reference numeral S1 in FIG. 1. In the circuit arrangement shown, the electric turn-off circuit comprises the capacitor C1 as well as the switch S2, preferably configured as a MOSFET, which is connected in series to the gate cathode electrode of the semiconductor component S1. The gate terminal G2 of the MOSFET S2 is connected to a control unit (not shown) that serves to control the MOSFET S2. Inside the charging circuit, the capacitor C1 is connected via the terminals K and C at a source of energy (not shown), by means of which it is charged. At the same time. The terminal K constitutes the cathode terminal of the semiconductor component S1.

The capacitor C1 is also serially connected to the capacitor C2. Two connecting points 80 and 81 are provided in a series connection between the terminal of the capacitor C1 on the cathode side and the terminal of the capacitor C2 connected to this terminal. The cathode terminal of the semiconductor component S1 is connected to the connecting point 80, so that a terminal of the capacitor C1 is connected to the cathode terminal. The gate terminal G1 of the semiconductor component S1 is connected to the connecting point 81 via a switch S3 preferably configured as a MOSFET, so that a connection is established between the gate terminal G1 and the terminal of the capacitor C2 that is connected to the cathode terminal K via the switch S3.

Between the terminal of the capacitor C1 that is not connected to the cathode terminal and the terminal of the capacitor C2 that is connected to said terminal, the series connection has a connecting point 82 to which the gate terminal G1 is connected via the switch S2. Another connecting point 83 is provided in the series connection between the connecting point 82 and the capacitor C2, and the cathode terminal K of the semiconductor component S1 is connected to this connecting point 83 via a switch 4 that is preferably configured as a MOSFET. In this context, the switch S4 is installed between the connecting point 83 and a connecting point 84 that is provided in the series connection, for example, between the connecting points 80 and 81.

In addition, a resistor R2 is installed between the connecting points 82 and 83. Moreover, a diode D1 is installed between the connecting points 81 and 84.

When the switches S3 and S4 are turned off, the capacitors C2 are charged from the capacitor C1 via the diode D1 and the resistor R2. Here, due to the considerably higher turn-off current in comparison to the turn-on current pulse, the capacitor C1 has a larger capacitance than the capacitor C2. In this context, the charging procedure especially can be carried out while the semiconductor component S1 is turned off, that is to say, while the switch S2 is turned on. In this case, the diode D1 prevents the capacitor C2 from losing its charge if the voltage of the capacitor C1 drops.

The MOSFETs S3 and S4 are triggered by means of a synchronous control signal. For this purpose, the gate terminals of the MOSFETs S3 and S4 can be connected, for example, to a shared control terminal G3, as shown in FIG. 13. If the switches S3 and S4 are turned on, then the capacitor C2 is short-circuited via the gate-cathode channel of the semiconductor component S1, as a result of which a high and steep current pulse is generated that turns on the semiconductor component S1.

During the turn-on procedure, the diode D1 prevents short-circuiting of the two terminals of the capacitor C2. Moreover, turning on the switch S4 causes the two terminals of the appertaining C1 to be connected to each other. Here, the resistor R2 prevents short-circuiting of the capacitor C1, which could damage the switch S4 configured as a MOSFET. The dimensioning of the resistor R2 is a function of a compromise between a fast recharging of the capacitor C2 and a limited loading of the switch S4, which is configured as a MOSFET, during the turn-on procedure.

Even though FIG. 15 only shows each circuit element inside the circuit arrangement as one element, the circuit elements can also comprise several identical components connected in parallel. For instance, especially the switches S1, S2 and S3 can be implemented in the form of several parallel MOSFETs in order to ensure sufficient current-carrying capacity on the part of the switches. Moreover, the capacitors C1 and C2 can each be implemented in the form of several capacitors connected in parallel for purposes of providing sufficient capacitance. Furthermore, the diode D1 can be implemented in the form of several diodes connected in parallel.

Moreover, the driver circuit is shown in FIG. 15 as a driver circuit for a gate terminal of a semiconductor component S1 on the cathode side. In the case of semiconductor components S1 that have a gate on the cathode side and on the anode side, however, an analogous circuit arrangement can also be used to trigger the gate on the anode side.

For the circuit arrangement presented here, the energy for the current pulse to turn on the semiconductor component S1 is provided by the capacitor C1 of the turn-off unit 20. Furthermore, the gate terminal G of the semiconductor component is connected to an external current source (not shown in FIG. 13) that provides the continuous current that is applied to the gate terminal when the semiconductor component is turned on.

The circuit arrangement shown in FIG. 15 comprises the turn-off unit 20 as well as the turn-on unit 50 of the semiconductor component SI, each of which is depicted in FIG. 15 by means of a box drawn with a broken line. The circuit arrangement is preferably integrated into the housing 10 of the semiconductor component S1. As a result, the electric turn-off circuit as well as the electric turn-on circuit have a short channel and thus a low leakage inductance.

The gate terminals of the switches S2, S3 and S4, which are configured as MOSFETs, can lead out of the housing via connection lines and can be connected to a control unit of an external driver stage of the semiconductor component S1. Moreover, as already elaborated upon, a control unit 51 connected to an external driver stage can also be arranged inside the housing 10 of the semiconductor component S1, the switches S2, S3 and S4 being triggered by said control unit.

The current source that is connected to the gate terminal G1 of the semiconductor component S1 and that applies a continuous current to the gate terminal G1 when the semiconductor component is turned on is preferably arranged in the external driver stage. Moreover, the external driver stage preferably contains the energy source by means of which the capacitor C1 is charged. Since the currents conveyed from the driver stage to the housing 10 have relatively low current intensities or relatively low change rates of the current intensity, there is no need for an especially low-inductive connection between the external driver stage and the housing 10. This makes it possible to arrange the driver stage at a greater distance from the housing 10, as a result of which, for instance, the inverter can have a more compact and simple design.

The invention claimed is:

1. A housing for a semiconductor device, the housing comprising:
   a semiconductor substrate that is arranged between two contact elements, one contact element forming an anode contact element and another contact element forming a cathode contact element, the semiconductor substrate having, on at least one surface, a gate electrode that is contacted by a gate contact element, the first contact element forming a surface arranged across from the gate electrode and at a distance from the gate electrode;
   at least one driver unit for generating a gate current, the driver unit comprising a first terminal that is contacted with the gate contact element, and a second terminal that is contacted with a first of the two contact elements; and
   a spring element arranged so that a spring force brings the gate contact element into pressure contact with the gate electrode and, at substantially the same time, the spring force brings the second terminal of the driver unit into pressure contact with the surface of the first contact element that is located across from the gate electrode.

2. The housing according to claim 1, wherein the driver unit has at least one switch that is arranged on a surface of a support element facing the gate electrode and that is contacted with the gate contact element.

3. The housing according to claim 1, wherein the spring force generated by the spring element acts essentially perpendicular to the surface of the support element.

4. The housing according to claim 1, wherein the driver unit has at least one capacitor, the capacitor being arranged on a surface of the flat support element facing away from the gate electrode and is contacted with the first contact element.

5. The housing according to claim 1, wherein the switch and the capacitor are connected in series between the gate contact element and the first contact element.

6. The housing according to claim 1, wherein the switch and the capacitor are arranged on opposite surfaces flat of the support element.

7. The housing according to claim 1, wherein the semiconductor substrate is configured as a round disk, and the gate electrode is located in the center of the surface of the semiconductor substrate, and wherein the first contact element has a hollow space in which the gate contact element, the driver unit and the spring element are arranged, the hollow space forming a surface, that is located across from the gate electrode.

8. The housing according to claim 1, wherein the semiconductor substrate has a ring-shaped gate electrode and wherein the gate contact element is configured to be ring-shaped and the driver unit has a ring-shaped support element that is arranged concentrically relative to the disk-shaped first contact element, and a plurality of switches are arranged at angular distances from each other on a surface of the ring-shaped support element facing the gate electrode.

9. The housing according to claim 8, wherein a plurality of spring elements are distributed along a ring, the spring elements exerting a spring force oriented essentially perpendicular to the opposite surfaces of the ring-shaped support element.

10. The housing according to claim 8, wherein the semiconductor substrate has a ring-shaped gate electrode and that several driver units are arranged along a ring, each of said driver units having a first terminal that is contacted with a gate contact element and each such unit being associated with at least one spring element that exerts a spring force that brings the gate contact element into pressure contact with the gate electrode and, at the same time, brings the second terminal of the driver unit into pressure contact with the surface of the first contact element that is located across from the gate electrode.

11. The housing according to claim 1, wherein the semiconductor substrate has a gate electrode on each of the opposite surfaces, the gate electrode being contacted by an associated gate contact element, whereby each gate electrode is associated with at least one driver unit having a first terminal that is contacted with the gate contact element associated with this gate electrode, and having a second terminal that is contacted with one of the two contact elements, each contact element forming a surface that is located across from a gate electrode and that is arranged at a distance from this gate electrode, and each gate electrode being associated with a spring element that is arranged in such a way that a spring force brings the gate contact element associated with this gate electrode into pressure contact with this gate electrode and, at substantially the same time, the spring force brings the second terminal of the driver unit associated with this gate electrode into pressure contact with the surface of one of the contact elements that is located across from this gate electrode.

12. The housing according to claim 1, wherein at least one MOSFET is connected in series between a surface of the semiconductor substrate on the cathode side and the cathode contact element.

13. The housing according to claim 12, wherein the driver unit comprises at least one switch that is connected in series between the gate contact element and the cathode contact element.

14. The semiconductor device according to claim 13, wherein the driver unit comprises a support element arranged, at least in sections, between the semiconductor substrate and the first contact element, the support element having conductive boards on opposite surfaces, and a conductive board facing away from the semiconductor substrate is brought into pressure contact with the first contact element by the spring element, the conductive board facing the semiconductor substrate having at least a first segment connected to a cathode electrode of the semiconductor substrate and at least a second segment that is insulated from the first segment and that is contacted with the gate contact element, and the first segment and the second segment each being contacted by means of a switch with the conductive board facing away from the semiconductor substrate.

15. The semiconductor device according to claim 12, wherein the semiconductor device is an ETO.

* * * * *